(12) United States Patent
Benkhan

(10) Patent No.: US 9,590,581 B2
(45) Date of Patent: Mar. 7, 2017

(54) SYSTEM AND METHOD FOR REDUCTION OF SIGNAL DISTORTION

(71) Applicant: Vladimir Benkhan, Toronto (CA)

(72) Inventor: Vladimir Benkhan, Toronto (CA)

(*) Notice: Subject to any disclaimer, the term of this patent is extended or adjusted under 35 U.S.C. 154(b) by 80 days.

(21) Appl. No.: 14/174,149

(22) Filed: Feb. 6, 2014

(65) Prior Publication Data
US 2015/0222119 A1    Aug. 6, 2015

(51) Int. Cl.
| H04R 5/00 | (2006.01) |
| H03K 5/00 | (2006.01) |
| H03G 11/00 | (2006.01) |
| H04R 19/02 | (2006.01) |
| H04R 23/00 | (2006.01) |
| H03G 9/02 | (2006.01) |
| H04R 3/04 | (2006.01) |

(52) U.S. Cl.
CPC ........... *H03G 11/002* (2013.01); *H03G 9/025* (2013.01); *H04R 19/02* (2013.01); *H04R 23/002* (2013.01); *H04R 3/04* (2013.01)

(58) Field of Classification Search
CPC .... H04S 7/307; H03G 3/3005; H03G 3/3089; H04N 5/357; H04M 1/035; H04M 1/0281; H04R 19/02; H04R 23/002
USPC ......... 327/551–559; 704/500, E19.001, 226; 381/107, 61, 104, 94.1–94.7, 99; 330/250, 278
See application file for complete search history.

(56) References Cited

U.S. PATENT DOCUMENTS

| 4,039,979 | A | 8/1977 | Carbrey |
| 4,332,697 | A | 6/1982 | Kimura et al. |
| 4,628,278 | A | 12/1986 | Bottman |
| 4,999,585 | A | 3/1991 | Burt et al. |
| 5,133,015 | A | 7/1992 | Scholz |
| 6,515,604 | B2 | 2/2003 | Delano |
| 6,697,492 | B1 | 2/2004 | Yamaguchi et al. |
| 6,753,728 | B2 | 6/2004 | Okubo et al. |
| 8,094,835 | B2 | 1/2012 | Shimura et al. |
| 8,180,081 | B2 * | 5/2012 | Lunner .......................... 381/318 |
| 8,738,385 | B2 * | 5/2014 | Chen ........................... 704/500 |
| 8,855,332 | B2 * | 10/2014 | Choi et al. .................... 381/107 |

* cited by examiner

*Primary Examiner* — Dinh T Le
(74) *Attorney, Agent, or Firm* — Mark B. Eisen

(57) ABSTRACT

A system for suppressing signal harmonic distortion caused by a main signal processing device provides processing for an electrical signal containing sine components of multiple frequencies. A post-processor reduces the amplitude of each frequency, relative to other frequencies, as the frequency increases, thus suppressing harmonics, which have higher frequencies than their respective elementary signals. To compensate for frequency distortion caused by the differential frequency suppression in the post-processing stage, a pre-processor provided upstream of the main signal processing device provides frequency-dependent signal processing having a generally opposite effect to that of the post-processor, increasing the amplitude of each frequency of the signal passing through the pre-processor, relative to other frequencies, as the frequency increases. The resulting output signal thus has substantially the same frequency spectrum as the original signal while distortion-causing harmonics are reduced or eliminated.

2 Claims, 5 Drawing Sheets

SYSTEM AND METHOD FOR REDUCTION OF SIGNAL DISTORTION

FIELD OF THE INVENTION

This invention relates to the suppression of distortion in electrical signals. In particular, this invention relates to a system and method for reducing harmonic distortion in complex signals containing multiple sine signals of various frequencies or for monochromatic signals with variable frequency.

BACKGROUND OF THE INVENTION

FIG. 1 illustrates a prior art signal-processing device 10, in the example shown a sound signal amplifier as a main distortion generator in the circuit. The input 12 accepts a signal, for example a line level signal, from an audio source such as a CD player, musical DAC device or the like. The device 10 amplifies the input signal and via output 14 transmits the amplified signal to a transducer, for example conventional electromagnetically-driven speaker, to generate sound waves corresponding to the output electrical signal.

The processing of any electrical signal, for example modulation-demodulation, analog-to-digital (ADC) and digital-to-analog (DAC) conversions or amplification as in the embodiment illustrated, can distort the signal waveform. According to Fourier's theorem, the damaged original sine signal (as with every periodical signal) can be represented as the sum of sine signals of divisible frequencies (harmonics), the lowest harmonic frequency (1st harmonic) being the fundamental frequency of the original signal. A coefficient of divisibility provides the number of each harmonic. Under the principle of superposition, all harmonics above the fundamental are additive to the original signal sine waveform and therefore cause signal distortion. Thus, in order to restore the original signal waveform, it is sufficient to suppress all harmonics except the 1st harmonic (fundamental).

If the original signal has a sine form of stable frequency, the distorted signal can typically be corrected by a high-quality resonance pass filter having the same frequency as the original elementary signal. Such a filter will pass only the original signal frequency, and thus eliminate higher harmonics to restore the original signal waveform. However, when the original signal contains two or more elementary (sine) signals of random frequencies, this method cannot be used to restore the original signal waveform from a processed signal.

It would accordingly be beneficial to provide a system and method for the reduction of signal distortion in a processed signal consisting of multiple frequency sine components.

BRIEF DESCRIPTION OF THE DRAWINGS

In drawings which illustrate by way of example only a preferred embodiment of the invention.

DETAILED DESCRIPTION OF THE INVENTION

The invention provides frequency-dependent signal processing for an electrical signal containing multiple frequency sine components, whereby harmonics generated by the elementary sine signals of various frequencies can be suppressed relative to their respective elementary signals. The invention will be described in the context of an audio signal distorted as a result of processing through an audio amplifier 10, however the principles of the invention apply to any electrical signal distorted as a result of some type of processing, including without limitation modulation-demodulation, conversion between analog and digital, amplification, pre-amplification, equalization etc.

The post-processor 40 is designed such that within a given frequency range (or ranges) the amplitude of a signal passing through the post-processor 40 is reduced as the frequency increases (i.e. for any two signals within the given frequency range or within each range of two or more given ranges, the signal with higher frequency has a lower transfer coefficient than the signal with the lower frequency), referred to herein as a "negative frequency gradient." Thus, because harmonics have higher frequencies than their respective elementary signals, in the post-processing stage harmonics generated within the main processing device will be suppressed more (or amplified less) than the corresponding fundamental signals from which the harmonics were generated.

However, this differential frequency suppression has a negative effect: higher frequency components of the original signal will have a lower transfer coefficient than lower frequency components, creating "frequency distortion."

Figure 1:
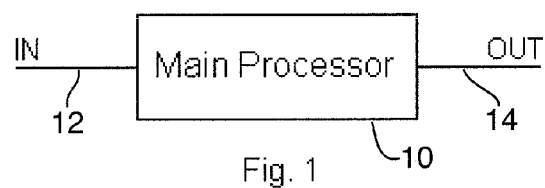
FIG. 1 is a schematic diagram of a prior art signal-processing device with signal distortion generation.
Figure 2:
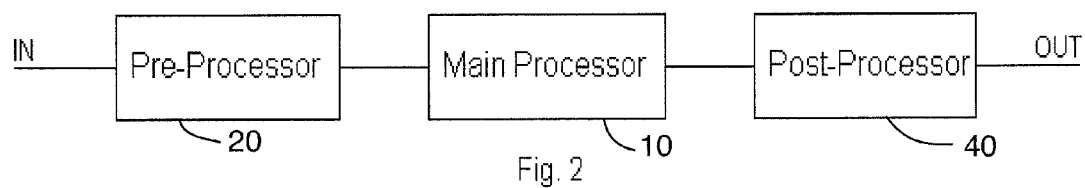
FIG. 2 is a schematic diagram of the signal-processing device of FIG. 1 with signal distortion suppression according to the invention.

To compensate for frequency distortion created by the post-processor 40, a pre-processor 20 is provided upstream of the input of the main processing device (amplifier 10), as shown in FIG. 2. The pre-processor 20 provides frequency-dependent signal processing having a generally opposite effect to that of the post-processor 40, i.e. within a given frequency range (ranges) the amplitude of signal passing through the pre-processor 20 increases as the frequency increases (i.e. for any two signals within the given range or within each range of two or more given ranges, the signal with lower frequency has a lower transfer coefficient than the signal with the higher frequency), referred to herein as a "positive frequency gradient." In effect, the pre-processor 20 boosts the higher frequency components of the input signal before they are processed by the main processing device, e.g. audio amplifier 10, and before the higher-frequency harmonics are generated. Accordingly, in the post-processing stage 40, as harmonics generated by the amplifier 10 are suppressed the higher frequency elementary signals that were boosted in the pre-processing stage are reduced generally to their original levels (proportionate to other elementary frequencies), reducing or substantially eliminating frequency distortion caused by the amplifier 10.

Figure 3:
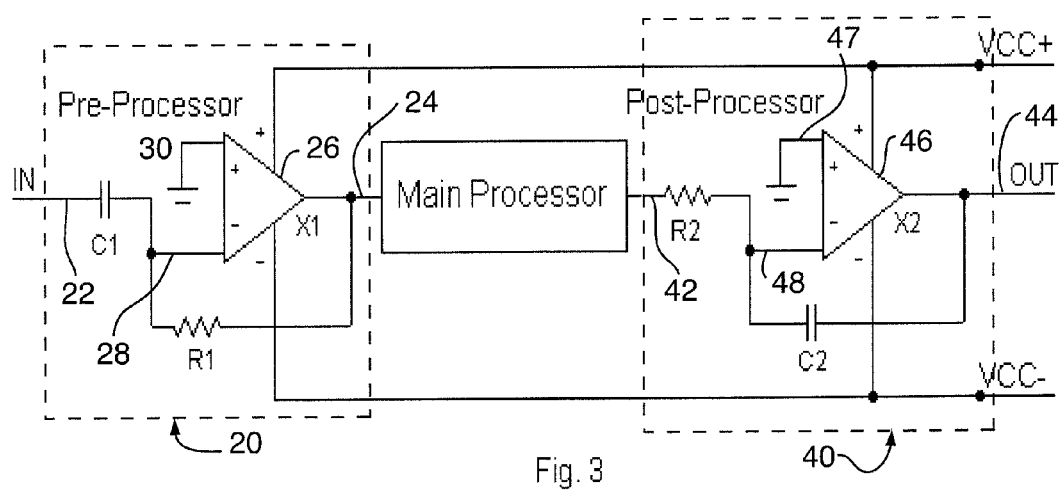
FIG. 3 is a schematic diagram of a simplified example of an embodiment of the invention using based on operational amplifiers.

FIG. 3 illustrates a basic "ideal" embodiment of the invention, in which the pre-processor 20 comprises a differentiator and the post-processor 40 comprises an integrator. In this embodiment both processors 20, 40 are based on operational amplifiers. The pre-processor 20 illustrated has an input 22 connected to the output of a signal source (not shown), for example in the case of the audio amplifier 10 illustrated a line-level output from a CD player, digital audio device or other sine signal source.

The source signal is passed to the inverting input 28 of op amp 26 through capacitor C1 having a capacitance C1F. The non-inverting input 30 of op amp 26 is grounded. A feedback resistor R1 having a resistance R1Ω bridges the non-inverting input 28 and the op amp output 24.

The pre-processed signal, inverted and intentionally frequency pre-distorted by the pre-processor 20, is fed to the input 12 of the main processing device, in the embodiment shown an audio amplifier 10, which produces a processed signal at its output 14. The processed signal, in addition to being pre-distorted by the differentially amplified frequencies produced by the pre-processor 20, is also distorted by harmonics generated during signal processing by the main processing device 10. The processed signal is passed to the input 42 of the integrator 40, through resistor R2 having a resistance R2Ω to the inverting input 48 of op amp 46. The non-inverting input 47 of op amp 46 is grounded. A feedback capacitor C2 having a capacitance C2F bridges the non-inverting input 48 and the op amp output 44.

Figure 4:
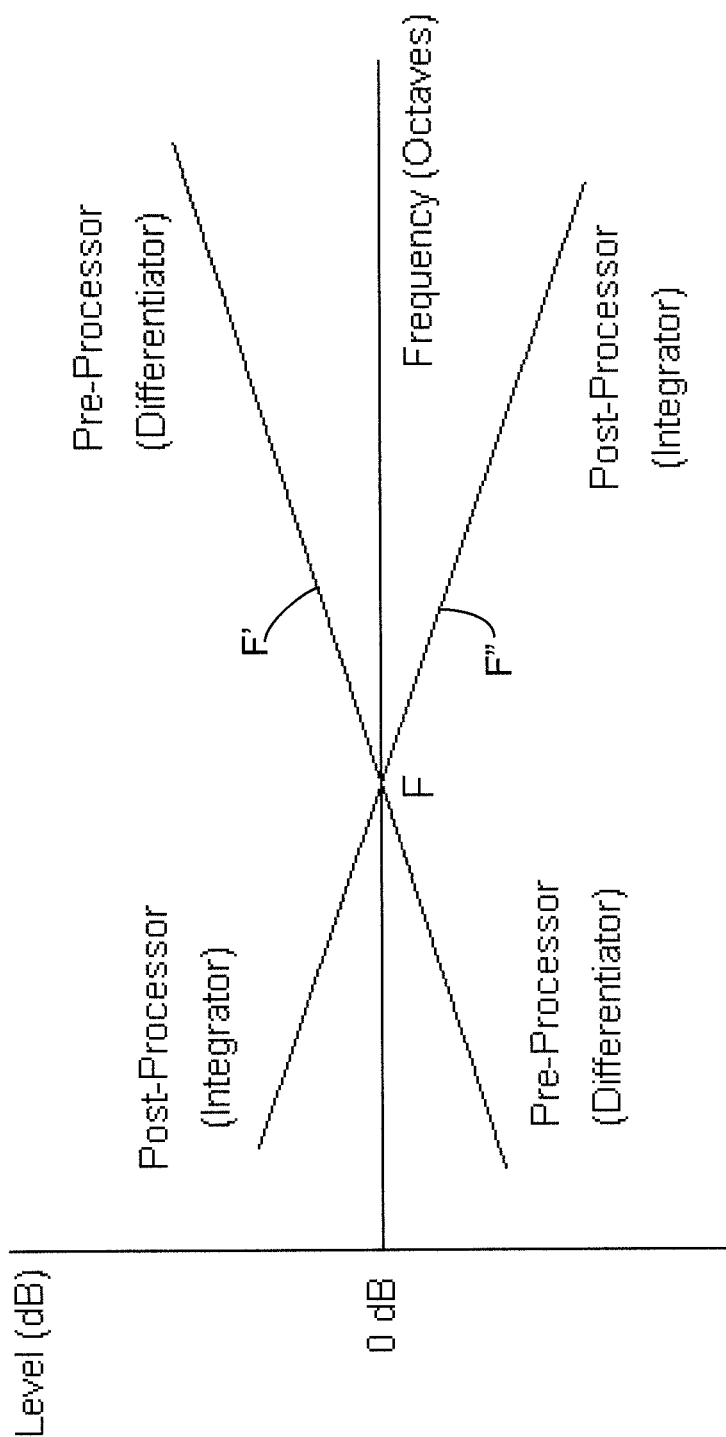
FIG. 4 is a graph showing the frequency characteristics of the pre-processor and post-processor illustrated in FIG. 3.

FIG. 4 illustrates the frequency characteristics for pre-processor 20 and post-processor 40 of FIG. 3. The transfer coefficient K1 of pre-processor 20 depends on signal frequency F' according to the formula:

$$K1=2*\pi*F'*R1\Omega*C1F$$

This provides a positive frequency gradient +6 dB/octave. K1=1 for signal frequency F_dif, where:

$$F\_dif=1/(2*\pi*R\Omega*C1F)$$

The transfer coefficient K2 of post-processor 40 depends on signal frequency F'' according to the formula:

$$K2=1/(2*\pi*F''*R2\Omega*C2F)$$

This provides a negative frequency gradient −6 dB/octave. K2=1 for signal frequency F_int, where:

$$F\_int=1/(2*\pi*R2\Omega*C2F)$$

To achieve opposite signal processing for the pre-processor 20 (differentiator) and post-processor 40 (integrator) and a substantially zero-effect on the original signal with simultaneous depression of harmonic distortion, the following ratio is required: F_dif=F_int=F (the cross-point of the two plots on FIG. 4). The condition of this ratio is: R1Ω*C1F=R2Ω*C2F. This produces the plots F' and F'' for the pre-processor 20 and post-processor 40, respectively, in FIG. 4.

Essentially, by amplifying high frequency components of the input signal more than the low frequency components of the input signal, the pre-processor 20 neutralizes the frequency distortion that will be created by the post-processor 40 in the course of suppressing harmonics in the post-processing stage. Characteristics of the pre-processor 20 and post-processor 40 should therefore be generally opposite in order to achieve a zero-sum effect at the output of the post-processor 40, as illustrated in FIG. 4 (wherein the signal level and frequency are illustrated in exponential scales).

Figure 5:
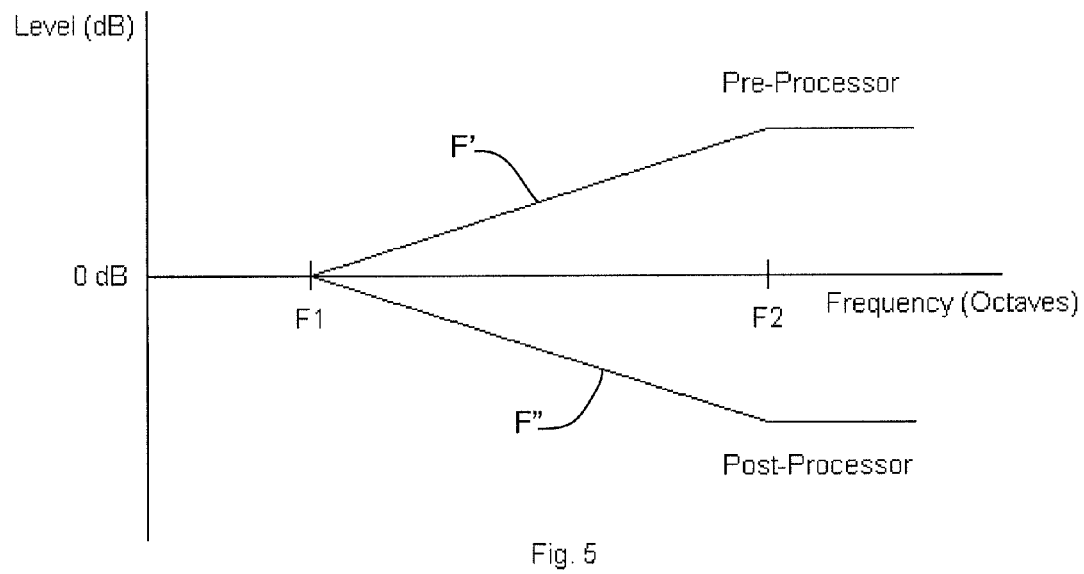
FIG. 5 is a graph showing the frequency characteristics of pre-processor and post-processor in an embodiment of the invention wherein the post-processor does not have active elements.

FIG. 5 illustrates frequency plots for the pre-processor 20 and post-processor 40 in the situation where the post-processor 40 is composed only of passive elements such as resistors, capacitors and inductors. Such a passive device does not generate its own harmonic distortion, which can be necessary in some special situations. The processing range is between the frequencies F1 and F2. The post-processor 40 does not amplify signals, but merely depresses them beginning from the frequency F1. Between frequency plots F1 and F2 post-processor 40 has a negative frequency gradient. Out of this range, its characteristic is linear. To compensate for the frequency distortion generated by the post-processor 40, the pre-processor 20 has a positive frequency gradient within the same range (between F1 and F2 plots). It additionally amplifies input signals, the highest amplification being at and above F2 frequencies.

Figure 6:
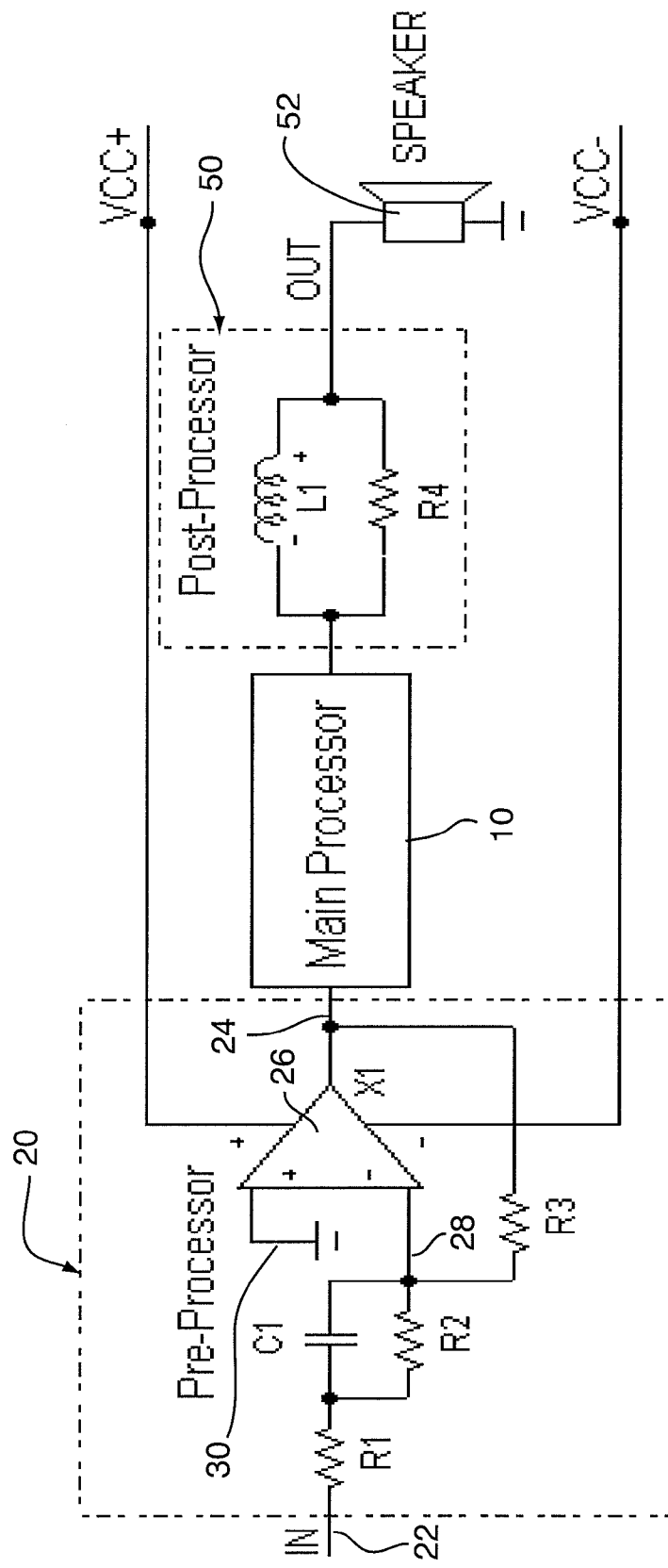
FIG. 6 is a schematic diagram of a simplified example of an embodiment of the invention using a passive post-processor.

FIG. 6 illustrates a simplified sample electrical scheme for the device of the invention utilizing a passive post-processor 50 comprising an inductor L1 having an inductance L1H and resistor R4 having a resistance R4Ω connected in parallel, which transmits the signal from the output of the main processor 10 to a speaker 52 having an impedance Z1. Feedback resistor R3 having a resistance R3Ω is coupled directly between the output 24 of the pre-processor op amp 26 and inverting input 28. Based on an impedance Z1, frequencies F1 and F2 and, for example, a capacitance of C1, in order to achieve a zero-sum effect the values for the other electronic components can be calculated according to following formulas:

$$L1H=Z1/(2*\pi*F1);$$

$$R4\Omega=2*\pi*F2*L1H;$$

$$R2\Omega=R3\Omega=1/(2*\pi*F1*C1F);$$

$$R1\Omega=1/(2*\pi*F2*C1F).$$

This scheme has additional bonus. The impedance of inductor L1 depends on the frequency F of the signal. It is equal to Z1 (the impedance of the speaker 52) on F1 and increases proportionally to frequency to F2 when it is limited by resistor R4. For frequencies above F1, the "voltage output" amplifier 10 (Main Processor) operates with speaker 52 as a "current output" device. Speakers generally have an impedance that depends on frequency because of their interior inductance (for electro-magnetic devices) and capacitance (for piezoelectric devices), resonance features, etc. The output audio signal of speaker 52 depends on the current through its coil or crystal, and unstable impedance leads to instability of the audio signal in the case of a "voltage output" amplifier. Thus, the high output impedance of a "current output" amplifier stabilizes the speaker current and improves the linearity of its output.

This scheme leaves the "voltage output" amplifier with its original low output impedance for frequencies under F1. It may thus be necessary when operating the device of the invention with bass acoustic systems that have strong low frequency resonances to dampen the acoustic system by the low-impedance output of "voltage output" audio amplifier through the post-processor 50.

Figure 7:
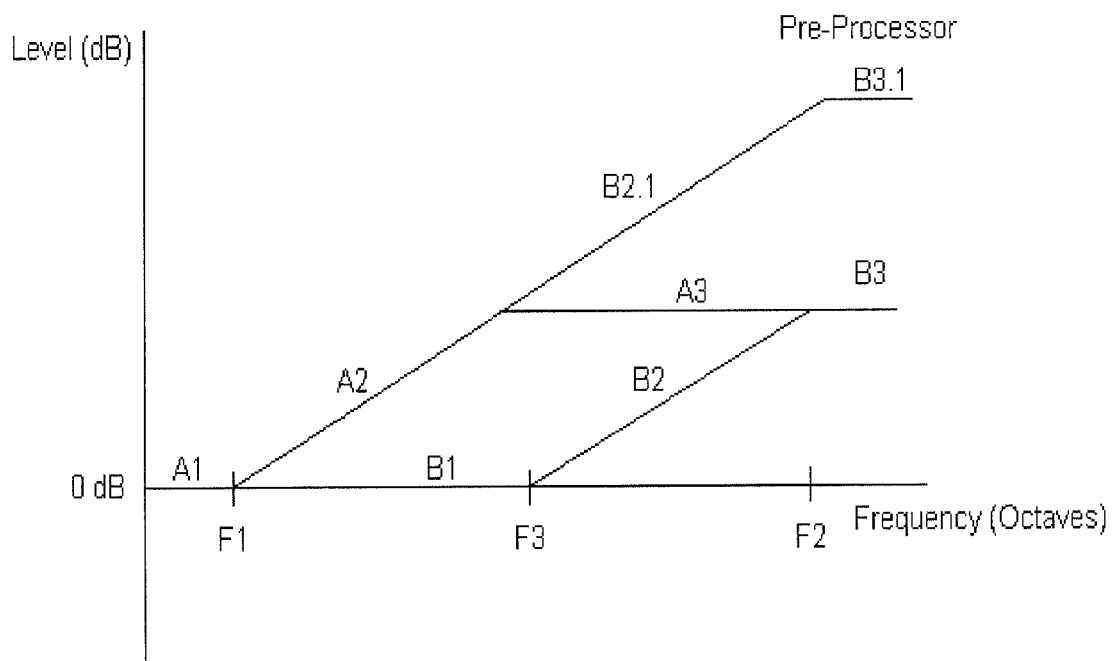
FIG. 7 is a graph showing the frequency characteristics of the pre-processor in an embodiment of the invention wherein pre-processing is effected in a plurality of steps to minimize the distortion generated by active elements of the pre-processor.

FIG. 7 illustrates transfer coefficient as a function of frequency in the situation where the frequency range F1→F2 of the signal being pre-processed is too wide and the amplification required by the pre-processor is high enough to generate noticeable distortion inside the pre-processor itself. In this case, pre-processing can be done in two (or more) steps with lower amplification in each step. The embodiment of FIG. 6 essentially divides the frequency range F1→F2 into two frequency ranges F1→F3 and F3→F2, and pre-processing is effected by two sub-processors within the pre-processor 20, connected in-line (i.e. operating one after another). The first sub-processor produces plot A1→A2→A3 and the second sub-processor has characteristic B1→B2→B3 superposed onto the upper limit of the first sub-processor. The resulting amplitude vs. frequency characteristic is A1→A2→B2.1→B3.1.

Figure 8:
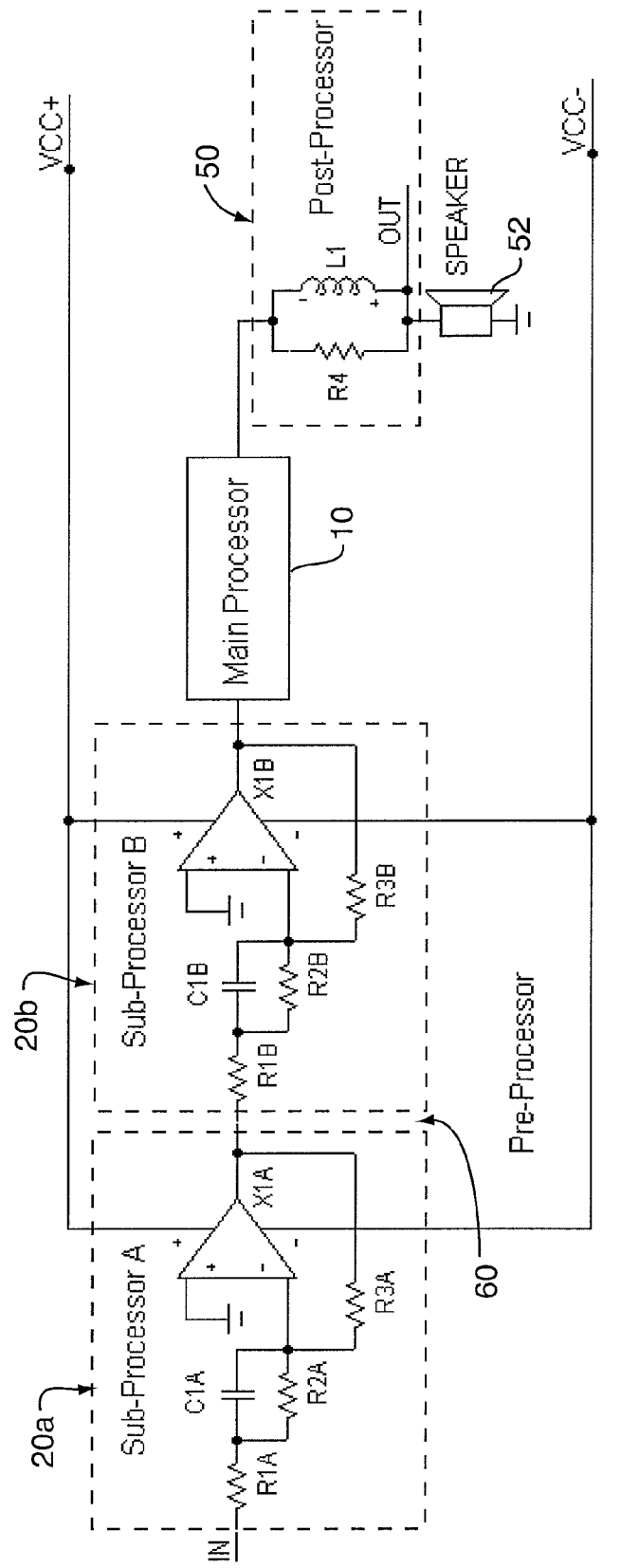
FIG. 8 is a schematic diagram of a simplified example of an embodiment of the invention using a two-step pre-processor and a passive post-processor to produce the graph of FIG. 7.

FIG. 8 illustrates an embodiment of the invention using an active pre-processor and a passive post-processor 50 as in FIG. 6, however in the embodiment of FIG. 8 the pre-processor 60 comprises two sub-processors 20a, 20b, which combine to produce the plots shown in the graph of FIG. 7. Sub-processor 20a processes the input signal within the frequency range F1→F3 and sub-processor 20b processes the output of sub-processor 20a within the frequency range F3→F2 of FIG. 7. The operation of the embodiment of FIG. 8 is otherwise similar to that of the embodiment of FIG. 6.

It will be appreciated that some harmonics have so little effect on the amplified source signal, particularly the highest harmonic frequencies, that it will not always be necessary to target all harmonics for suppression. It will also be appreciated that some frequencies may not require processing, depending upon the application; for example in the case of an audio signal it may be unnecessary to process frequencies above the upper or below the lower limits of human hearing, respectively, even though the source signal may comprises elementary frequencies having values beyond these thresholds.

It will also be appreciated that the system and method of the invention can be used for the depression of signal distortion generated as a result of non-electronic processes within a complex system such as radio transmitting/receiving, transmission of information signals through optical waveguides, acoustic delay elements etc.

Embodiments of the present invention having been described in detail by way of example, it will be apparent to those skilled in the art that variations and modifications may be made without departing from the invention. For example, without limitation, it will be appreciated that the principles of the invention can be applied to any sine signal as a source signal, audio signals being heretofore described by way of non-limiting example only. The invention includes all such variations and modifications as fall within the scope of the claims.

The invention claimed is:

1. A system for reducing distortion in an electrical source signal caused by harmonics generated by a main signal processing device, the source signal containing a plurality of elementary frequencies, each elementary frequency having an initial amplitude, comprising a pre-processor comprising a circuit for differentially changing the initial amplitudes of at least some of the plurality of elementary frequencies in the source signal, to generate a pre-processed output signal for input to the main signal processing device, each of the frequencies in the pre-processed output signal having a pre-processed amplitude, the pre-processed amplitudes of higher frequencies being increased from the corresponding initial frequencies more than the pre-processed amplitudes of lower frequencies are increased from the corresponding initial frequencies, or the pre-processed amplitudes of higher frequencies being decreased from the corresponding initial frequencies less than the pre-processed amplitudes of lower frequencies are decreased from the corresponding initial frequencies, or a combination thereof, and a post-processor comprising a circuit for differentially changing amplitudes of at least some of the elementary frequencies in the signal output by the main signal processing device to generate a post-processed output signal, each of the frequencies in the post-processed output signal corresponding to the at least some of the plurality of elementary frequencies having a post-processed amplitude, the post-processed amplitudes of higher frequencies being decreased more than the post-processed amplitudes of lower frequencies, or the post-processed amplitudes of higher frequencies being amplified less than the post-processed amplitudes of lower frequencies, or a combination thereof, whereby at least some harmonics generated by the main signal processing device are suppressed.

2. A method for reducing distortion in an electrical source signal, containing a plurality of elementary frequencies, each elementary frequency having an initial amplitude, comprising the steps of:

a. differentially changing the initial amplitudes of at least some of the plurality of elementary frequencies in the source signal to generate a pre-processed output signal for input to the main signal processing device, each of the frequencies in the pre-processed output signal having a pre-processed amplitude, the pre-processed amplitudes of higher frequencies being increased from their corresponding initial frequencies more than the pre-processed amplitudes of lower frequencies are increased from their corresponding initial frequencies, or the pre-processed amplitudes of higher frequencies being decreased from the corresponding initial frequencies less than the pre-processed amplitudes of lower frequencies are decreased from the corresponding initial frequencies, or a combination thereof, b. processing the pre-processed signal via the main signal processing device and outputting a processed output signal; and c. differentially changing amplitudes of at least some of the elementary frequencies in the signal output by the main signal processing device to generate a post-processed signal, each of the frequencies in the post-processed signal corresponding to the at least some of the plurality of elementary frequencies having a post-processed amplitude, the post-processed amplitudes of higher frequencies being decreased from the corresponding frequencies in the processed output signal more than the post-processed amplitudes of lower frequencies are decreased from the corresponding frequencies in the processed output signal, or the post-processed amplitudes of higher frequencies being amplified less than the post-processed amplitudes of lower frequencies, or a combination thereof, whereby at least some harmonics generated by the main signal processing device are suppressed.

* * * * *